US008553827B2

(12) United States Patent
Zhang

(10) Patent No.: US 8,553,827 B2
(45) Date of Patent: Oct. 8, 2013

(54) ADC-BASED MIXED-MODE DIGITAL PHASE-LOCKED LOOP

(75) Inventor: Gang Zhang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 376 days.

(21) Appl. No.: 12/582,661

(22) Filed: Oct. 20, 2009

(65) Prior Publication Data

US 2011/0090998 A1  Apr. 21, 2011

(51) Int. Cl.
*H03D 3/24* (2006.01)

(52) U.S. Cl.
USPC ........... 375/374; 375/373; 375/375; 375/376; 455/260; 327/147; 327/148; 327/150; 327/156; 327/157; 327/159; 327/536; 331/16; 331/34; 331/175

(58) Field of Classification Search
CPC ..... H04L 7/0331; H03L 7/1072; H03L 7/095; H03L 7/0898; H03L 7/0896; H03L 7/0895; H03L 7/0893; H03L 7/0891
USPC .......... 375/354, 371, 373–376; 327/141, 147, 327/156, 148, 150, 157, 159, 536; 455/260, 455/516; 331/16, 34, 175
See application file for complete search history.

(56) References Cited

U.S. PATENT DOCUMENTS

| | | | |
|---|---|---|---|
| 5,072,195 A * | 12/1991 | Graham et al. | 331/2 |
| 5,929,678 A * | 7/1999 | Kasperkovitz et al. | 327/157 |
| 6,369,730 B1 * | 4/2002 | Blanken et al. | 341/143 |
| 6,630,868 B2 | 10/2003 | Perrott et al. | |
| 6,859,158 B2 * | 2/2005 | Wada et al. | 341/155 |
| 6,977,537 B2 * | 12/2005 | Chaudhuri et al. | 327/156 |
| 7,277,032 B2 * | 10/2007 | Lin | 341/131 |
| 7,400,181 B2 * | 7/2008 | Metz et al. | 327/149 |
| 7,408,419 B2 * | 8/2008 | Ko | 331/17 |
| 7,548,122 B1 * | 6/2009 | Groe et al. | 331/16 |
| 7,583,211 B1 * | 9/2009 | Wu | 341/120 |
| 7,595,698 B2 * | 9/2009 | Ben-Bassat | 331/17 |
| 2005/0077969 A1 * | 4/2005 | Lalt et al. | 331/1 A |
| 2006/0214737 A1 * | 9/2006 | Brown et al. | 331/16 |
| 2008/0079501 A1 * | 4/2008 | Hulfachor et al. | 331/16 |
| 2009/0015338 A1 | 1/2009 | Frey | |

FOREIGN PATENT DOCUMENTS

| TW | 200614676 A | 5/2006 |
|---|---|---|
| TW | 200709570 | 3/2007 |

OTHER PUBLICATIONS

International Search Report and Written Opinion—PCT/US2010/040684, International Search Authority—European Patent Office—Oct. 6, 2010.
Taiwan Search Report—TW099121609—TIPO—Feb. 23, 2013.
Kester "Which ADC Architecture is Right for Your Application?", Jun. 2005, Analog Dialogue 39-06, pp. 1-8.*

(Continued)

\* cited by examiner

*Primary Examiner* — Sophia Vlahos
(74) *Attorney, Agent, or Firm* — S. Hossain Beladi

(57) ABSTRACT

A Phase-Locked Loop (PLL) includes a Phase-to-Digital Converter (PDC), a programmable digital loop filter, a Digitally-Controlled Oscillator (DCO), and a loop divider. Within the PDC, phase information is converted into a stream of digital values by a charge pump and an Analog-to-Digital Converter (ADC). The stream of digital values is supplied to the digital loop filter which in turn supplies digital tuning words to the DCO. A number of types of ADCs can be used for the ADC including a continuous-time delta-sigma over-sampling Digital ADC and a Successive Approximation ADC. The voltage signal on the charge pump output is a small amplitude midrange voltage signal. The small voltage amplitude of the signal leads to numerous advantages including improved charge pump linearity, reduced charge pump noise, and lower supply voltage operation of the overall PLL.

24 Claims, 11 Drawing Sheets

DIFFERENTIAL CHARGE PUMP

TDC ADPLL

PDC ADPLL

ANALOG PLL

PFD

DIFFERENTIAL CHARGE PUMP

VREF IS THE VOLTAGE HALFWAY DOWN THE RESISTOR DIVIDER OF THE ADC

| VREF - VIN | ADC_OUT[1:3] | SD1 | SD2 | SU1 | SU2 |
|---|---|---|---|---|---|
| BETWEEN +0.5 AND +0.7 | 011 | OFF | OFF | ON | ON |
| BETWEEN +0.3 AND +0.5 | 010 | OFF | OFF | OFF | ON |
| BETWEEN +0.1 AND +0.3 | 001 | OFF | OFF | ON | OFF |
| BETWEEN -0.1 AND +0.1 | 000 | OFF | OFF | OFF | OFF |
| BETWEEN -0.3 AND -0.1 | 101 | ON | OFF | OFF | OFF |
| BETWEEN -0.5 AND -0.3 | 110 | OFF | ON | OFF | OFF |
| BETWEEN -0.7 AND -0.5 | 111 | ON | ON | OFF | OFF |

FEEDBACK CONTROLLED CURRENT SOURCE

ADC-BASED MIXED-MODE DIGITAL PHASE-LOCKED LOOP

BACKGROUND INFORMATION

1. Technical Field

The disclosed embodiments relate to the Phase-Locked Loops (PLLs), and more particularly to PLLs usable in local oscillators within radio receivers and transmitters.

2. Background Information

Phase-Locked Loops (PLLs) are used in many applications, including use in the local oscillators of cellular telephone receivers and transmitters. There are different circuits that can be used to realize such a PLL. Possibilities for realizing the PLL of a local oscillator include analog PLLs and so-called "All-Digital" PLLs (ADPLLs). One type of ADPLL is a Time-to-Digital Converter All-Digital Phase-Locked Loop (TDC ADPLL). FIG. 1 (Prior Art) is a diagram of a TDC ADPLL 1. TDC ADPLL 1 includes an accumulator 2, a Time-to-Digital Converter (TDC) 3, a summer 4, a digital loop filter 5, and a Digitally-Controlled Oscillator (DCO) 6. A second type of ADPLL is a Phase-to-Digital Converter All-Digital Phase-Locked Loop (PDC ADPLL). FIG. 2 (Prior Art) is a diagram of a Phase-to-Digital Converter All-Digital Phase-Locked Loop (PDC ADPLL) 7. PDC ADPLL 7 includes a Phase-to-Digital Converter (PDC) 8, a digital loop filter 9, a DCO 10, and a digital loop divider 11. In both ADPLL architectures, a delay line is used to measure timing in the time domain, and to convert a time difference between signal edges into a digital value. The control loop is often sensitive to reference clock jitter, to jitter of multiples of the reference clock, and/or to other noise. The mechanisms by which such sources of noise interfere with proper operation of the ADPLL can be complex. Achieving proper control and calibration of the delay line can be difficult. The design of the timing control circuitry can be complex.

Another possibility for realizing the PLL of a local oscillator is an analog PLL. FIG. 3 (Prior Art) is a diagram of a fractional-N analog PLL 12. Analog PLL 12 includes a phase detector 13, an analog charge pump 14, an analog filter 15, a Voltage-Controlled Oscillator (VCO) 16, and a divider 17. In this example, the analog PLL 12 is a fractional-N PLL, and includes a delta-sigma modulator 18. In a cellular telephone application, such an analog PLL circuit topology is generally simpler to design and to build and to debug than an ADPLL, but it involves an analog charge pump and an analog loop filter. Due to limiting headroom and footroom requirements of an analog charge pump, an ADPLL generally cannot operate at low supply voltages. Moreover, in a cellular telephone application, a single integrated PLL circuit is to be able to operate in multiple different frequency bands. Unlike a digital loop filter whose coefficients can be changed, an analog loop filter is generally less flexible. It is sometimes difficult or impossible to make a single ADPLL circuit operate satisfactorily in the multiple different frequency bands as required in a cellular telephone application. Moreover, an analog loop filter may require a large amount of die space to implement, and therefore may be undesirably expensive and may require the use of off-chip components.

SUMMARY

A PLL, referred to here as an "ADC-Based Mixed-Mode Digital Phase-Locked Loop", includes a Phase-to-Digital Converter (PDC), a digital loop filter, a Digitally-Controlled Oscillator (DCO), and a loop divider. Within the PDC, phase/timing information is converted into a stream of digital values by a charge pump and an Analog-to-Digital Converter (ADC). The stream of digital values as output by the ADC is supplied to the digital loop filter, and the digital loop filter in turn supplies a stream of digital tuning words to the DCO. An oscillating signal output from the DCO is divided down in frequency by the loop divider to generate a feedback signal DIV_OUT that is supplied to a second input of the PDC. A first input of the PDC receives a reference clock signal XO.

The ADC within the PDC can be one of a number of different suitable types of ADCs including, but not limited to, a continuous-time delta-sigma oversampling Digital ADC, another type of continuous time ADC, another type of oversampling ADC, a Successive Approximation ADC (SAR ADC), another type of discrete-time ADC, a switched capacitor ADC, or a flash ADC.

In a first embodiment, the ADC is a continuous-time delta-sigma oversampling Digital ADC. The voltage signal on the output node of the charge pump is a small amplitude midrange voltage. The voltage signal is a small amplitude midrange voltage signal by virtue of the charge pump output signal being supplied onto a virtual ground input node of an active integrator. The small amplitude midrange voltage on the output of the charge pump leads to numerous advantages including improved charge pump linearity, reduced charge pump noise, and allowing the overall PLL to be operated from a lower supply voltage. The slowly varying phase error information in the signal output from the charge pump is oversampled because the ADC samples at a higher frequency (for example, the reference input clock signal frequency). Quantization noise associated with this sampling is moved to higher frequencies and is filtered out. Continuous-time operation of the ADC relaxes slew rate and bandwidth requirements on the operational amplifiers within the ADC, thereby reducing power consumption as compared to an embodiment involving a conventional discrete-time ADC. Whereas in a conventional TDC ADPLL phase/timing information is processed in the time domain such that timing control can be difficult, in the ADC-Based Mixed-Mode Digital PLL phase/timing information is converted into charge information. It is this charge information that is then processed. This makes the timing control circuitry relatively simple. In one example, the charge pump has a controllable gain. The gain of the charge pump is set to a lower value when the PLL is not in lock, whereas the gain of the charge pump is set to a higher value when the PLL is in lock. The digital loop filter is programmable and its coefficients are changed when the operating frequency of the PLL feedback loop is changed. When a cellular telephone is receiving in a first frequency band then the digital loop filter uses a first set of coefficients, whereas when the cellular telephone is receiving in a second frequency band then the digital loop filter uses a second set of coefficients.

In a second embodiment, the ADC is a discrete-time SAR ADC. In the SAR ADC embodiment like the continuous-time delta-sigma oversampling ADC embodiment, the output signal from the charge pump is a small amplitude and midrange voltage signal. In one example, the only significant analog component of the SAR ADC is a comparator, and the linearity requirements on this comparator are relaxed as compared to linearity requirements on an operational amplifier within the integrator of a delta-sigma oversampling ADC. Due to the reduced linearity requirements, the SAR ADC embodiment can be made to have lower power consumption as compared to the continuous-time delta-sigma oversampling ADC embodiment. The reduced linearity requirements also allow the SAR ADC to operate at lower supply voltages.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 4:
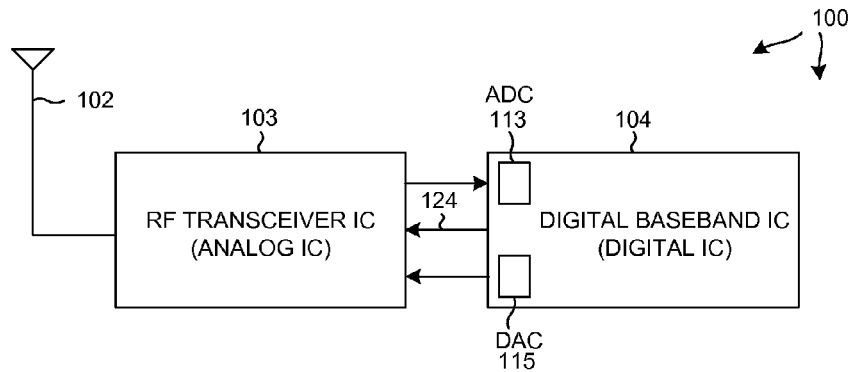
FIG. 4 is a very simplified high level block diagram of one particular type of mobile communication device 100 that employs an ADC-Based Mixed-Mode Digital PLL in accordance with one novel aspect.

FIG. 4 is a very simplified high level block diagram of one particular type of mobile communication device 100 in accordance with one novel aspect. In this example, mobile communication device 100 is a cellular telephone that uses a Code Division Multiple Access (CDMA) cellular telephone communication protocol. The cellular telephone includes (among several other parts not illustrated) an antenna 102 and two integrated circuits 103 and 104. Integrated circuit 104 is called a "digital baseband integrated circuit" or a "baseband processor integrated circuit". Integrated circuit 103 is an RF transceiver integrated circuit. RF transceiver integrated circuit 103 is called a "transceiver" because it includes a transmitter as well as a receiver.

Figure 5:
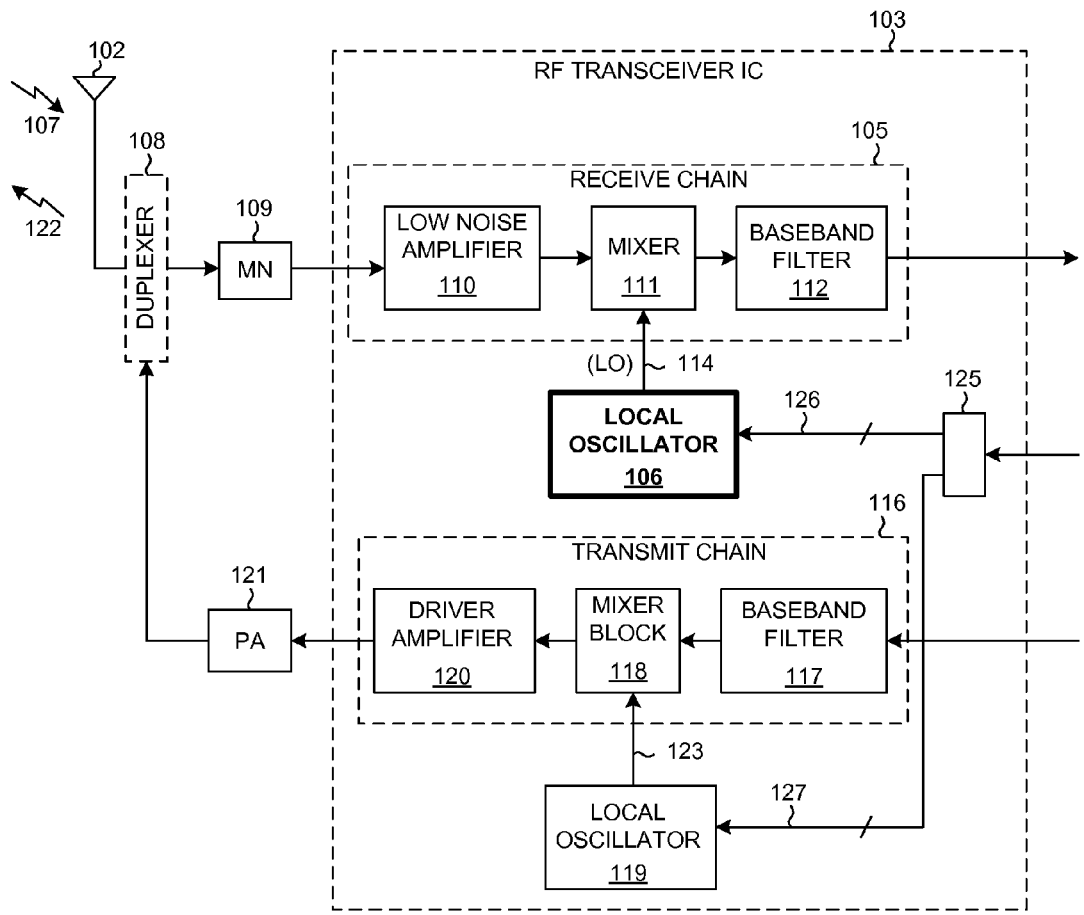
FIG. 5 is a more detailed block diagram of the RF transceiver integrated circuit 103 of FIG. 4.

FIG. 5 is a more detailed block diagram of the RF transceiver integrated circuit 103 of FIG. 4. The receiver includes what is called a "receive chain" 105 as well as a Local Oscillator (LO) 106. When the cellular telephone is receiving, a high frequency RF signal 107 is received on antenna 102. Information from signal 107 passes through duplexer 108, matching network 109, and through the receive chain 105. Signal 107 is amplified by Low Noise Amplifier (LNA) 110 and is down-converted in frequency by mixer 111. The resulting down-converted signal is filtered by baseband filter 112 and is passed to the digital baseband integrated circuit 104. An analog-to-digital converter 113 in the digital baseband integrated circuit 104 converts the signal into digital form and the resulting digital information is processed by digital circuitry in the digital baseband integrated circuit 104. The digital baseband integrated circuit 104 tunes the receiver by controlling the frequency of the Local Oscillator signal (LO) supplied on local oscillator output 114 to mixer 111.

If the cellular telephone is transmitting, then information to be transmitted is converted into analog form by a Digital-to-Analog Converter (DAC) 115 in the digital baseband integrated circuit 104 and is supplied to a "transmit chain" 116. Baseband filter 117 filters out noise due to the digital-to-analog conversion process. Mixer block 118 under control of local oscillator 119 then up-converts the signal into a high frequency signal. Driver amplifier 120 and an external power amplifier 121 amplify the high frequency signal to drive antenna 102 so that a high frequency RF signal 122 is transmitted from antenna 102. The digital baseband integrated circuit 104 controls the transmitter by controlling the frequency of a local oscillator signal supplied on local oscillator output 123 to mixer 118. Digital baseband integrated circuit 104 controls the local oscillators 106 and 119 by sending appropriate control information across a digital bus 124, through bus interface 125, and control lines 126 and 127.

Figure 6:
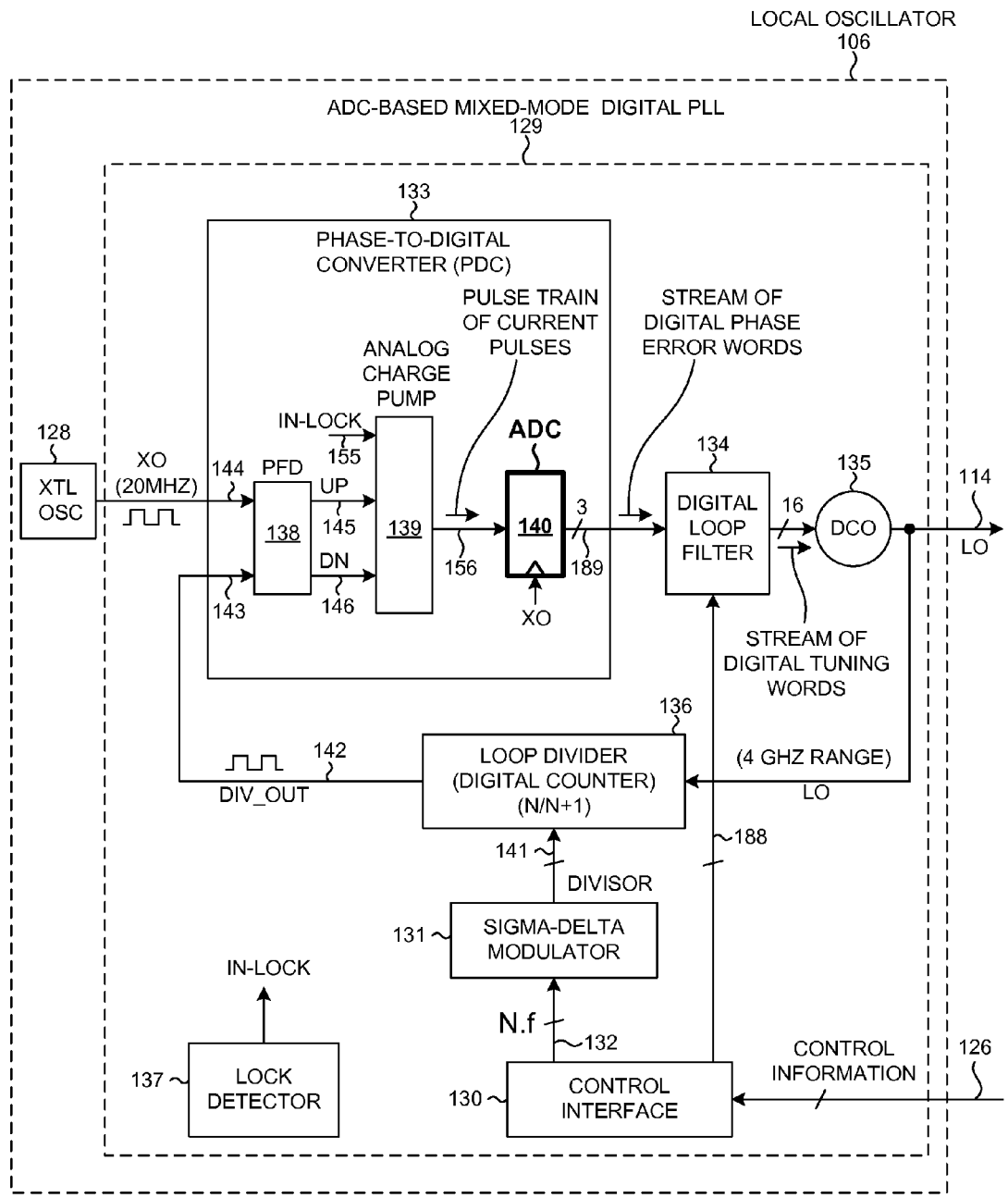
FIG. 6 is a more detailed block diagram of the ADC-Based Mixed-Mode Digital PLL 129 within the local oscillator 106 of FIG. 5.

FIG. 6 is a circuit diagram that shows local oscillator 106 of FIG. 5 in further detail. Local oscillator 106 includes a source 128 of a reference clock signal XO and an ADC-Based Mixed-Mode Digital PLL 129. Source 128 may be a crystal oscillator, or a portion of an oscillator, or another source of the reference clock signal XO such as a conductor through which the reference clock signal XO is communicated. Source 128 supplies the reference clock signal XO onto a first input lead 144 of a Phase-Frequency Detector (PFD) 138. The control information received via conductors 126 and control interface circuit 130 controls the ADC-Based Mixed-Mode Digital PLL 129 by setting a fractional F divisor value (N.f) supplied to a sigma-delta modulator 131 via conductors 132.

ADC-Based Mixed-Mode Digital PLL 129 includes a Phase-to-Digital Converter (PDC) 133, a digital loop filter 134, a Digitally-Controlled Oscillator (DCO) 135, a loop divider 136, the sigma-delta modulator 131, the control interface 130, and a lock detector circuit 137. PDC 133 in turn includes the PFD 138, a differential charge pump 139, and an Analog-to-Digital Converter (ADC) 140. DCO 135 receives a stream of sixteen-bit digital tuning words from the digital loop filter 134. At a given time, the sixteen-bit digital tuning word received by DCO 135 determines the frequency of the local oscillator output signal LO that is output by DCO 135 onto conductor 114. The local oscillator output signal LO is in this example a digital signal in the 4 GHz range. The output signal LO can be single-ended or differential.

Loop divider 136 frequency divides the single-bit local oscillator output signal LO by a multi-bit digital divisor value received from sigma-delta modulator 131 via conductors 141, and outputs the resulting divided-down single-bit feedback signal DIV_OUT onto conductor 142 and to a second input lead 143 of PFD 138. Sigma-delta modulator 131 changes the divisor value back and forth from an integer value N to the next integer N+1 over time such that over time the frequency of LO is divided by the fractional F value N.f. The "N" in the fractional F value "N.f" represents an integer, whereas the ".f" in the fractional value "N.f" represents a fractional value. As described above, the fractional value N.f by which the loop divider 136 divides is known to the local oscillator 106 after having been received from the digital baseband integrated circuit 104.

PFD 138 receives the reference clock signal XO on its first input 144 and receives the feedback DIV_OUT signal on its second input 143. From these signals, PFD 138 generates up charge pump control signal (UP) and down charge pump control signal (DN). The UP and DN signals are supplied to charge pump 139 via conductors 145 and 146, respectively.

Figure 7:
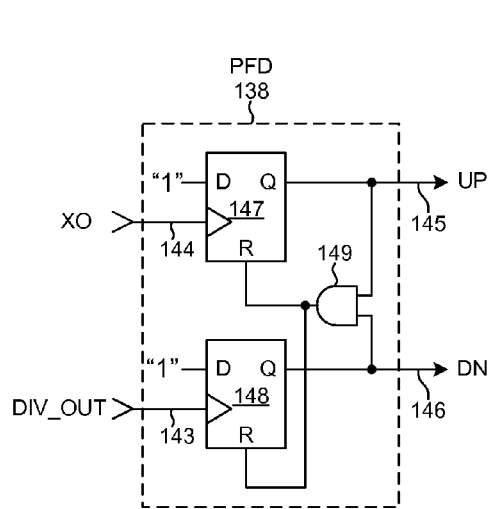
FIG. 7 is a circuit diagram of PFD 138 of FIG. 6.

FIG. 7 is a diagram of one implementation of PFD 138. PFD 138 includes a first flip-flop 147, a second flip-flop 148, and an AND gate 149. If both signals XO and DIV_OUT are initially at digital logic low values, and if both flip-flops 147 and 148 are reset and outputting digital logic low values, then AND gate 149 is outputting a digital logic low value and the flip-flops 147 and 148 are not in the condition of being reset. If the signal XO then transitions to a digital logic high value, then flip-flop 147 is set and the UP signal is asserted to a digital logic high value. This condition persists until the signal DIV_OUT transitions high. When the signal DIV_OUT transitions high, then flip-flop 148 is set and the signal DN is asserted high. When DN transitions high then both the UP and DN signals supplied onto the inputs of AND gate 149 are high. AND gate 149 therefore outputs a digital logic high value which asynchronously resets both flip-flops 147 and 148. Both signals UP and DN are then quickly deasserted to have digital logic low values. At this point shortly following the low-to-high transition of signal DN the PFD 138 is in its reset condition and is ready to measure the phase of another rising edge condition. The amount of time the signal DN is asserted is the amount of time required to asynchronously reset the flip-flops 147 and 148 through AND gate 149 and the asynchronous reset inputs of the flip-flops. The amount of time the signal UP is asserted high, however, varies depending on the phase difference between the rising edge of XO and the rising edge of DIV_OUT. The larger the phase difference, the longer the signal UP is asserted high.

If both signals XO and DIV_OUT are initially at digital logic low values, and if both flip-flops 147 and 148 are reset and outputting digital logic low values, and if the signal DIV_OUT then transitions to a digital logic high value before the signal XO, then flip-flop 148 is set. The DN signal is asserted high. This condition persists until the signal XO transitions high. When the signal XO transitions high, then flip-flop 147 is set and the signal UP is asserted high. At this point both signals UP and DN are high. The AND gate 149 therefore outputs a digital logic high value which asynchronously resets both flip-flops 147 and 148. Both signals UP and DN are deasserted to have digital logic zero values. The PFD 138 is then ready to measure another rising edge condition. The amount of time the signal UP is asserted is the amount of time required to asynchronously reset the flip-flops 147 and 148 through AND gate 149 and the asynchronous reset inputs of the flip-flops. The amount of time the signal DN is asserted high, however, varies depending on the phase difference between the rising edge of DIV_OUT and the rising edge of XO. The larger the phase difference, the longer DN is asserted high.

Figure 8:
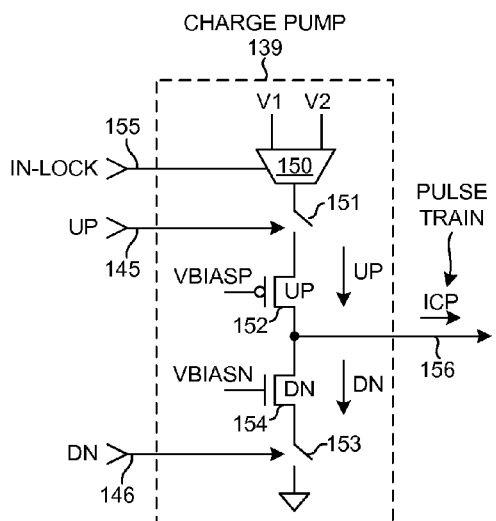
FIG. 8 is a circuit diagram of charge pump 139 of FIG. 6.

FIG. 8 is more detailed diagram of differential charge pump 139. Charge pump 139 includes a supply voltage selector 150, a first switch 151, and P-channel UP current source transistor 152, a second switch 153, and an N-channel DN current source transistor 154. Supply voltage selector 150 may, for example, be a analog multiplexer involving transmission gates. The gate of P-channel UP current source transistor 152 is biased by a gate bias voltage VBIASP. The gate of N-channel DN current source transistor 154 is biased by a gate bias voltage VBIASN. These bias voltages are set such that the UP and DN currents have desired magnitudes. The UP current flows when the control signal UP received via conductor 145 has a digital logic high value. The DN current flows when the control signal DN received via conductor 146 has a digital logic high value. If during a phase-measuring rising XO/DIV_OUT edge condition the signal UP is high longer than the signal DN is high, then a net amount of UP current flows. If, on the other hand, during a phase-measuring rising XO/DIV_OUT edge condition the signal DN is high longer than the signal UP is high, then a net amount of DN current flows.

If the signal IN-LOCK on input lead 155 is at a digital logic high value then supply voltage selector 150 supplies supply voltage V2 to switch 151, whereas when the signal IN-LOCK on input 155 is at a digital logic low value then the supply voltage selector 150 supplies supply voltage V1 to switch 151. Supply voltage V2 is a larger positive voltage than is supply voltage V1. When supply voltage V2 is supplied to switch 151, the amplitude magnitudes of the ICP current pulses output by charge pump 139 are greater (for example, 10 mA) than when the smaller supply voltage V1 is supplied to switch 151 (for example, 1 mA). Accordingly, the gain of the charge pump is greater when the signal IN-LOCK is asserted than it is when the signal IN-LOCK is not asserted. The pulses of UP current are supplied onto conductor and node 156. The pulses of DN current are drawn from conductor and node 156. The UP and DN current pulses together constitute a pulse train ICP.

Figure 9:
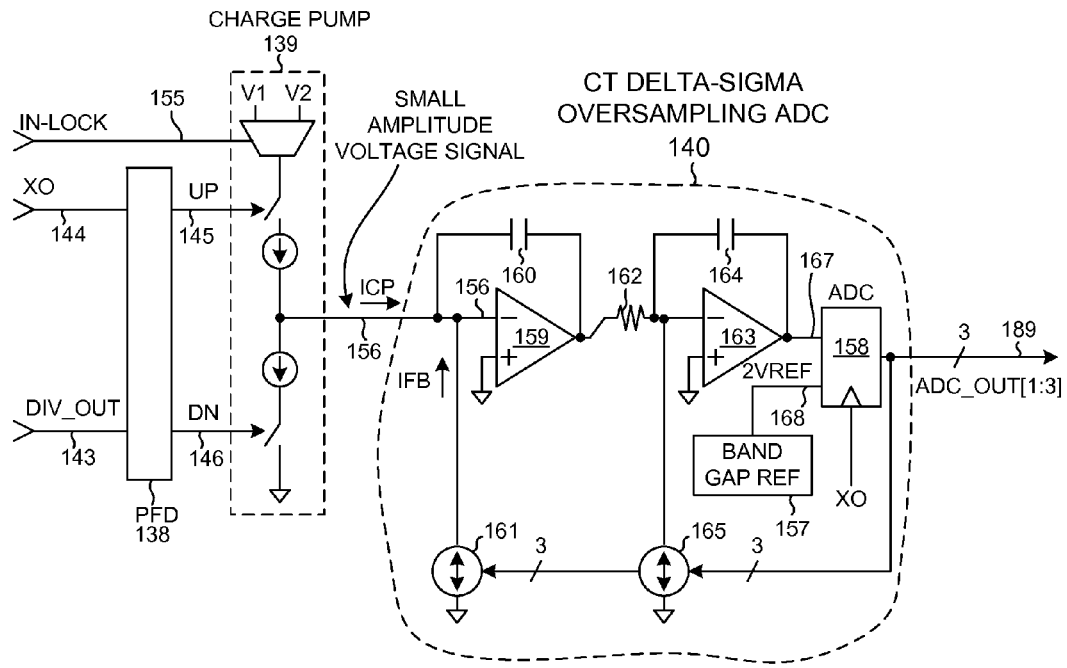
FIG. 9 is a diagram that shows an example in which the ADC 140 of the ADC-Based Mixed-Mode Digital PLL of FIG. 6 is a CT Delta-Sigma Oversampling ADC.

FIG. 9 is a more detailed diagram of the ADC 140 of FIG. 6. ADC 140 can be realized as any type of suitable ADC including, but not limited to, a continuous-time ADC, a discrete-time ADC, an oversampling ADC, a continuous time delta-sigma oversampling ADC, a discrete-time SAR ADC, a discrete-time switched capacitor ADC, and a flash ADC. FIG. 9 illustrates an example in which ADC 140 is a continuous-time delta-sigma oversampling ADC (CT delta-sigma oversampling ADC). ADC 140 includes two stages, a bandgap voltage reference 157, and an ADC 158. The first stage includes an operational amplifier 159, a capacitor 160, and a feedback controlled current source 161. The second stage includes a resistor 162, an operational amplifier 163, a capacitor 164, and a feedback controlled current source 165. The first and second stages together operate as an active integrator, with node 156 being an input signal node to the integrator. If the first stage is a dominant source of noise, then chopper stabilization can be applied by placing choppers around the first stage.

The integrator integrates the voltage on node 156 and supplies smoothed result onto an input 167 of ADC 158. The ADC 158 compares the voltage on input 167 to a voltage reference VREF. A voltage reference 2VREF that has twice the magnitude of comparison voltage VREF is received onto input 168 of ADC 158 for this purpose. ADC 158 outputs a three-bit digital value ADC_OUT[1:3] onto output conductors 189 each cycle of the reference clock XO. Each successive digital value ADC_OUT[1:3] is a digital phase error word that is a measure of how large the voltage difference is between the voltage signal received from the integrator on input 167 and the voltage VREF (one half of the voltage 2VREF received on input 168). The larger this voltage difference, the larger the absolute value of ADC_OUT[1:3]. The most significant bit ADC_OUT[3] indicates whether the integrator output signal on input 167 was higher than VREF, or lower than VREF. The resulting stream of digital phase error words ADC_OUT[1:3] controls the feedback controlled current sources 161 and 165. If the voltage difference between the integrator output signal and VREF is greater, then the feedback controlled current sources 161 and 165 are controlled to source or sink more current, whereas if the voltage difference between the integrator output signal and VREF is smaller, then the feedback controlled current sources 161 and 165 are controlled to source or sink less current. The result is negative feedback that stabilizes the integrator and the ADC. Over time, the average charge supplied by charge pump 139 onto node 156 is equal to the average charge removed from node 156 by feedback controlled current source 161. Operational amplifier 159 does not draw appreciable current from node 156 because its non-inverting input that is coupled to node 156 has a high input impedance.

Figures 10, 12:
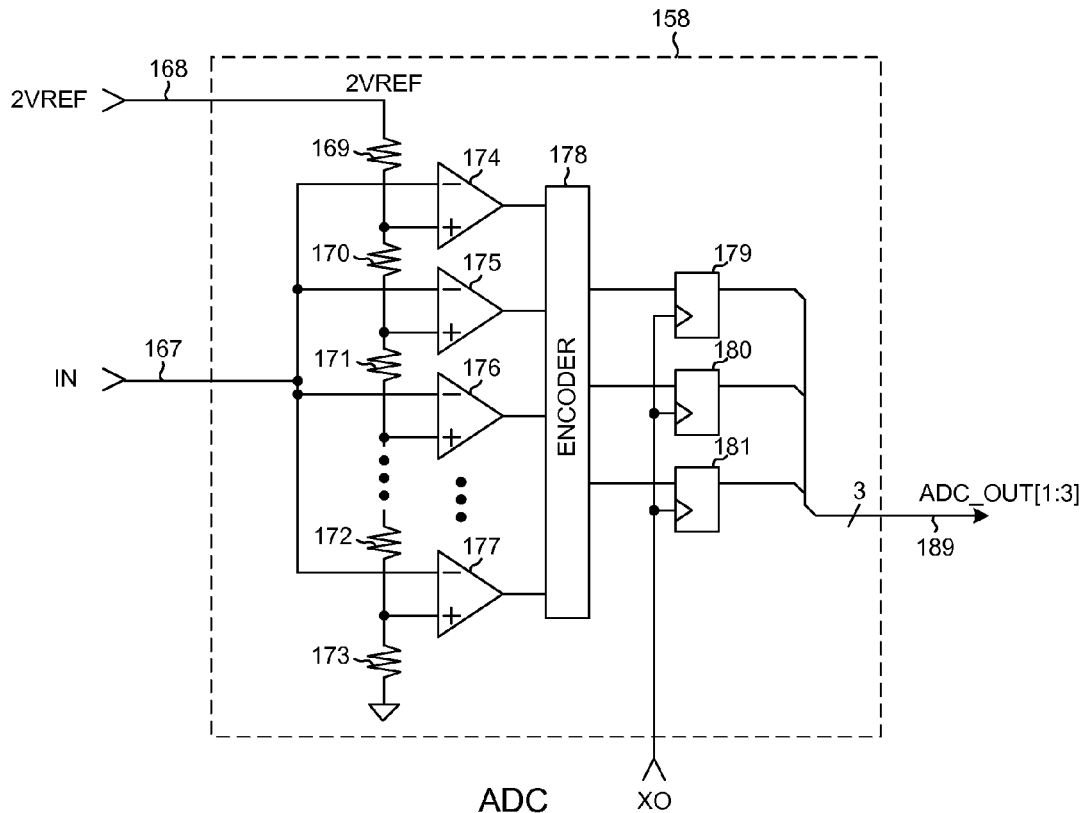
FIG. 10 is a diagram of ADC 158 of the CT Delta-Sigma Oversampling ADC 140 of FIG. 9.
FIG. 12 is a table that illustrates how the ADC of FIG. 10 and the feedback controlled current source of FIG. 11 operate together.

FIG. 10 is a more detailed diagram of ADC 158 of FIG. 9. There are many ways that ADC 158 can be realized. FIG. 10 illustrates just one example. ADC 158 includes a flash analog-to-digital converter involving a resistor ladder 169-173 and a corresponding set of comparators 174-177. The comparison voltage VREF is a voltage on a tap node of the ladder approximately midway down the ladder. The multi-bit output of this flash converter is supplied to a digital logic encoder 178. Encoder 178 converts the multi-bit output of the flash converter into a corresponding three-bit digital value. Three-bit digital values as output by encoder 178 are latched into a three-bit register 179-181 on the rising edges of the reference clock signal XO. The stream of three-bit values as output by the three-bit register 179-181 is the signal ADC_OUT[1:3].

Figure 11:
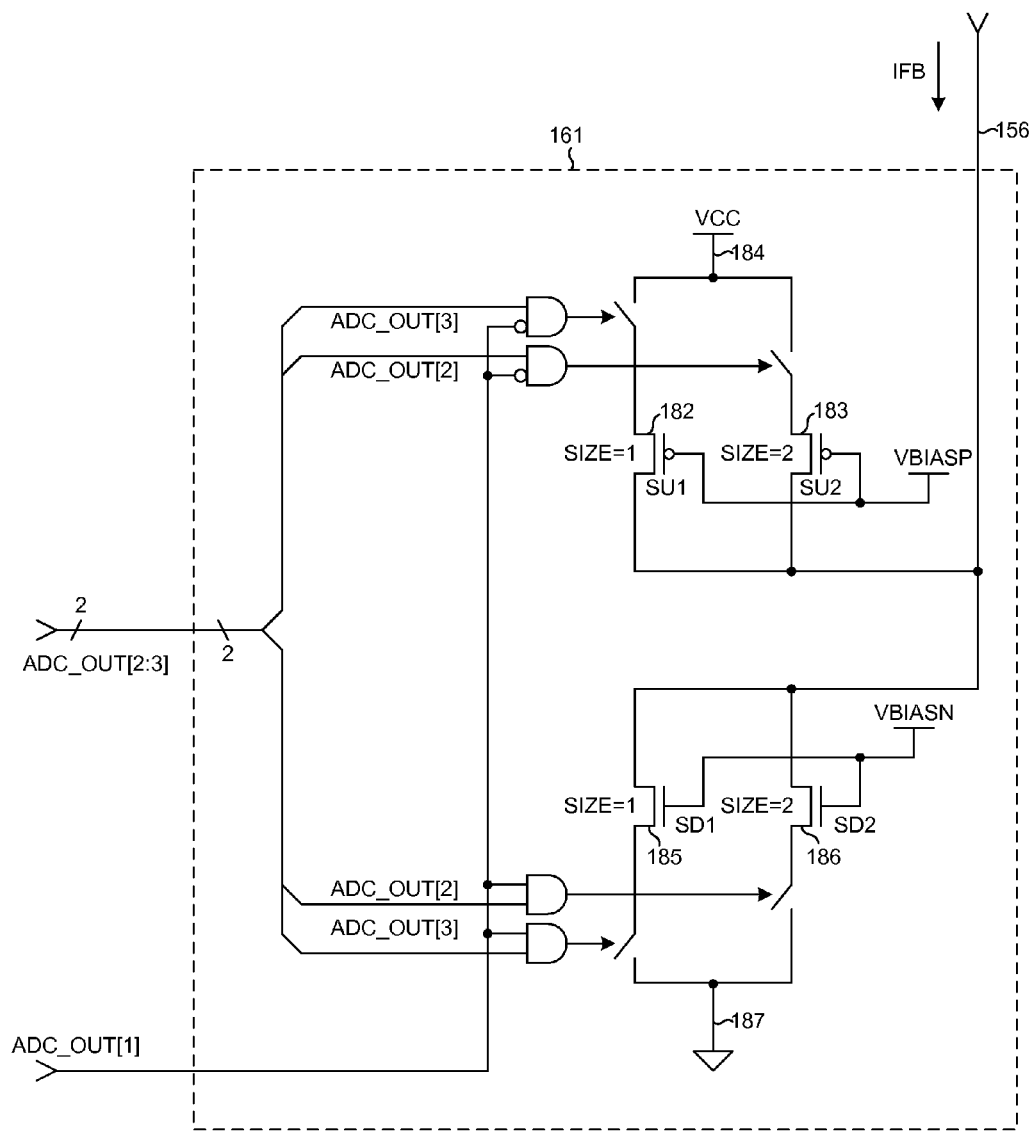
FIG. 11 is a circuit diagram of one of the feedback controlled current sources of the CT Delta-Sigma Oversampling ADC 140 of FIG. 9.

FIG. 11 is a more detailed circuit diagram of one feedback current source 161 of FIG. 9. P-channel UP switch transistors SU1 182 and SU2 183 are sized such that they source current onto node 156 in an amount determined by the two-bit value ADC_OUT[2:3] if the most significant bit ADC_OUT[1] is a digital logic low. This sourced current flows from supply voltage node 184, through parallel-connected transistors 182 and 183, and onto node 156. Similarly, N-channel DOWN switch transistors SD1 185 and SD2 186 are sized such that they sink current from node 156 in an amount determined by the two-bit value ADC_OUT[2:3] if the most significant bit ADC_OUT[1] is a digital logic high. This current flows from node 156, through parallel-connected transistors 185 and 186, and to a ground node 187. The signal conductors that carry the signals ADC_OUT[2:3] and ADC_OUT[3] that are illustrated on the left side of FIG. 11 are same signal conductors that extend to the outputs of ADC 158 in FIG. 9.

FIG. 12 is a table that illustrates an operation of ADC 158 and feedback current source 161 of FIG. 11. As indicated by the table, if the voltage difference between VREF (the voltage halfway down the resistor ladder of FIG. 10) and the voltage VIN on input node 167 (the voltage received from the two-stage integrator of FIG. 9) is between −0.1 volts and +0.1 volts, then the ADC_OUT[1:3] value is "000". The switch transistors SD1, SD2, SU1 and SU2 are all controlled to be OFF. The feedback controlled current source 161 neither supplies current onto, nor draws current from, node 156. This current is denoted IFB in the diagrams. If, however, the voltage difference between VREF and VIN is positive, then transistors SU1 and/or SU2 are controlled to be ON such that current IFB is positive. Current is sourced onto node 156. If the voltage difference between VREF and VIN is negative, then transistors SD1 and/or SD2 are controlled to be ON such that current IFB is negative. Current is sinked from node 156. Signal polarities are set such that negative feedback stabilizes the feedback loop of FIG. 9.

Accordingly, as illustrated in FIG. 6, ADC 140 supplies a stream of three-bit digital values ADC_OUT[1:3] to digital loop filter 134. The magnitude of the information content of this stream of three-bit values ADC_OUT[1:3] is indicative of the amount of phase error between the reference signal XO on first input lead 144 of PFD 136 and the feedback signal DIV_OUT on second input lead 143 of PFD 136. In one example, the signal output by charge pump 139 has a useful bandwidth of approximately 100 kHz, but ADC 140 oversamples this signal at the much higher reference clock frequency (for example, 20 MHz). Quantization noise is shaped to higher frequencies and is filtered out. Loop filter 134 has a bandwidth of 10 kHz. Although the ADC_OUT[1:3] values output by ADC 140 are only three-bit values, the effective resolution due to oversampling and filtering is ten to twenty bits of resolution, depending on the oversampling ratio.

In one advantageous aspect, loop filter 134 is a flexible and programmable digital filter whose coefficients can be changed under software control. The filter coefficients used by digital loop filter 134 are supplied in parallel via control interface 130 and conductors 188. A first set of filter coefficients is used if the ADC-Based Mixed-Mode Digital PLL 129 is used to generate the LO signal for receiving cellular communications in a first radio frequency communication band, whereas a second set of filter coefficients is used if the ADC-Based Mixed-Mode Digital PLL 129 is used to generate the LO for receiving cellular communications in a second radio frequency communication band.

In another advantageous aspect, the PLL charge pump is made to have a smaller gain when the PLL is in acquisition and is attempting to lock as compared to when the PLL is operating normally and is in-lock. During acquisition, the rate at which charge is being supplied onto, or off of, node 156 may be so great without charge pump gain reduction that the negative feedback of the integrator within ADC 140 would become overwhelmed. The integrator output may saturate. To prevent this, the gain of charge pump 139 during acquisition is controlled to have a smaller gain value, whereas the gain of charge pump 139 in normal operation with the PLL 129 is locked is a larger gain value. The relative gain values are set by setting voltages V1 and V2 in FIG. 8 appropriately. Whether the PLL is in lock or not is determined by lock detector circuit 137 of FIG. 6.

In another advantageous aspect, the PLL charge pump has improved linearity as compared to the charge pump of a conventional ADPLL. In the PLL of FIG. 6 and FIG. 9, the integrator input node 156 that the PLL charge pump drives is a "virtual ground" node 156. Due to the active two-stage integrator of FIG. 9, node 159 is a virtual ground and the voltage signal on node 159 is a small amplitude midrange voltage signal during normal PLL operation. The input impedance looking into the CT delta-sigma oversampling ADC is greater than 1M ohms. The term "small amplitude" here describes a relative relationship to the voltage difference between the supply voltages V1 and V2 at the top of the charge pump 139 and ground potential at the bottom of the charge pump 139. In one example, the "small amplitude" is approximately 0.05 volts peak-to-peak when the PLL is in lock, and when V2 is 1.3 volts. The headroom voltage is approximately 0.4 volts, and the footroom voltage is approximately 0.4 volts. The term "midrange" is relative to the voltage range between the supply voltages V1 and V2 at the top of the charge pump 139 and ground potential at the bottom of the charge pump 139.

Over time, the charge supplied onto node 156 due to current ICP pulses is the same as the charge taken off of node 156 due to current IFB. In a conventional analog charge pump circuit, the gain of the charge pump changes as a function of the voltage on the charge pump output. This changing gain is referred to as non-linearity. As the output voltage nears the positive supply voltage of the charge pump, the linearity of the charge pump degrades further as the P-channel transistor within the UP current source of the charge pump enters triode region operation. This is sometimes referred to as a "headroom" problem. The voltage difference between the positive supply voltage and the output voltage where this triode region operation begins can be referred to as the "headroom" voltage. Similarly, as the output voltage nears ground potential, linearity of the charge pump degrades seriously as the N-channel transistor within the DN current source enters triode region operation. The voltage difference between ground potential and this voltage where triode region operation begins may be referred to as the "footroom" voltage. In the PLL 129 of FIG. 6 that involves the CT Delta-Sigma Oversampling ADC 140 of FIG. 9, the charge pump 139 has improved linearity because the voltage signal on its output at node 156 is a small amplitude midrange voltage signal.

In another advantageous aspect, the PLL is operable at lower supply voltages as compared to a similarly performing conventional ADPLL. Due to the charge pump driving node 156 whose voltage changes very little as the PLL operates in lock, the voltage on node 156 can be set to be ideally slightly above the footroom voltage. The supply voltage can be as low as a voltage slightly greater than the sum of the headroom and footroom voltages. Because the voltage signal on the output of the charge pump is a small amplitude signal when the PLL is in-lock, the output voltage of the charge pump can remain in a small voltage operating range where neither the UP current source or the DN current source is operating in the triode region.

In another advantageous aspect, a charge pump that introduces less noise into the PLL can be employed as compared to the charge pump that would otherwise be required in a similarly performing conventional ADPLL. A conventional approach to improving charge pump linearity is to employ a more linear charge pump. A more linear charge pump, unfortunately, also generally introduces more noise into the charge pump output signal. In the PLL 129 of FIG. 6 that involves the CT Delta-Sigma Oversampling ADC 140 of FIG. 9, charge pump 139 need not be a highly linear charge pump due to the voltage on node 156 remaining substantially fixed during normal PLL operation. The voltage signal on node 156 is a small amplitude midrange voltage signal. Charge pump 139 can therefore be of a less linear type that introduces less noise into the charge pump output signal as compared to the charge pump of a similarly performing conventional ADPLL.

Figure 13A:
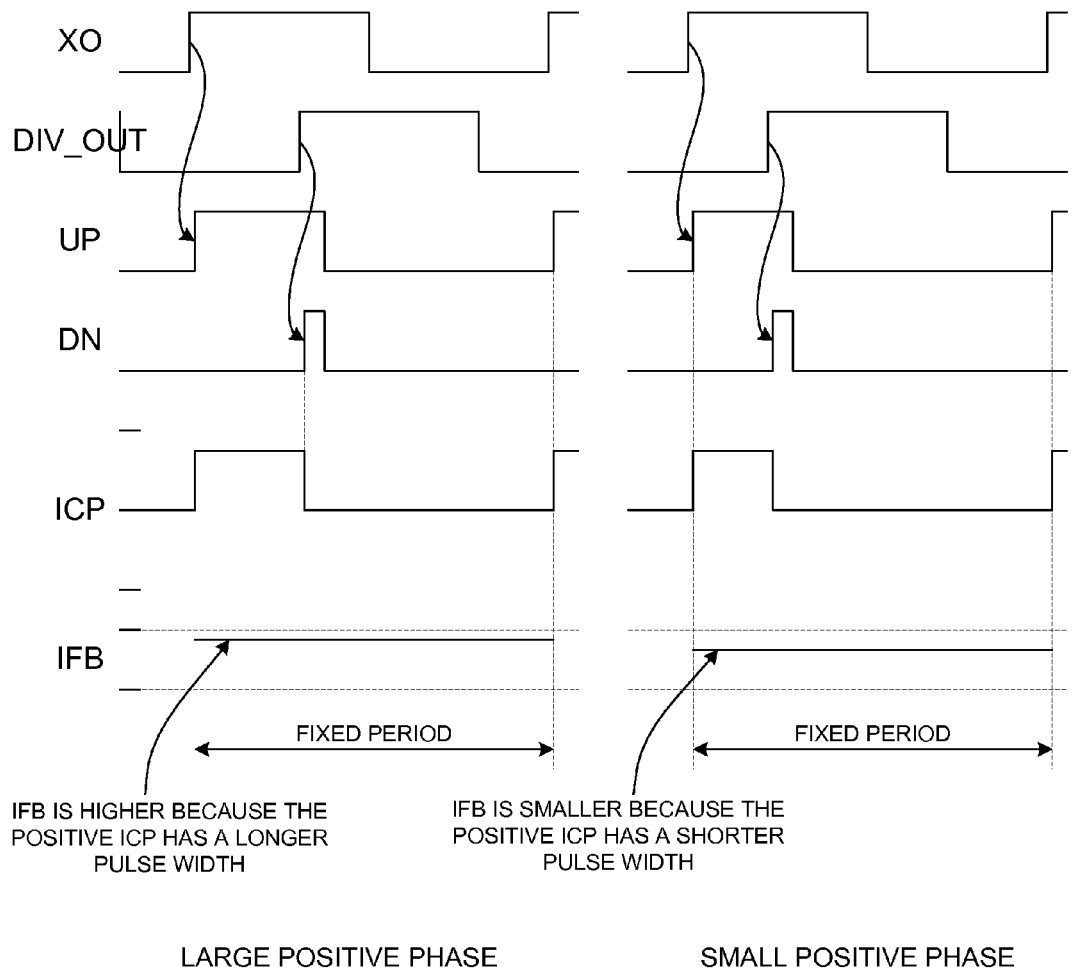
FIG. 13A is a waveform diagram that illustrates an operation of the ADC-Based Mixed-Mode Digital PLL of FIG. 6 in a situation in which the phase difference between the reference clock signal XO and the feedback signal DIV_OUT is positive.

FIG. 13A is a waveform diagram that illustrates an operation of the ADC-Based Mixed-Mode Digital PLL of FIG. 6. In both the time period illustrated on the left and in the time period illustrated on the right, the phase differences between reference clock signal XO and feedback signal DIV_OUT are positive (i.e., XO transitions high before DIV_OUT transitions high). The pulse of the charge pump output current ICP is therefore a positive pulse. A pulse of current ICP is being supplied onto node 156. In the time period illustrated to the left in FIG. 13A, the phase difference is greater as compared to the phase difference in the period illustrated to the right. The width of the ICP pulse in the time period to the left is therefore wider than the width of the ICP pulse in the time period to the right. The amount of charge supplied onto node 156 in the time period to the left is therefore greater than is the amount of charge supplied onto node 156 in the time period to the right. The feedback voltage IFB is set by the three-bit value ADC_OUT[1:3]. The magnitude of current IFB is therefore greater in the time period to the left than it is in the time period to the right. In each of the two time periods, the overall charge represented by the magnitude of current flow ICP multiplied by the pulse width is equal to the overall charge represented by the magnitude of IFB multiplied by the time period (current IFB flows throughout the entire time period) during which the IFB current is flowing.

Figure 13B:
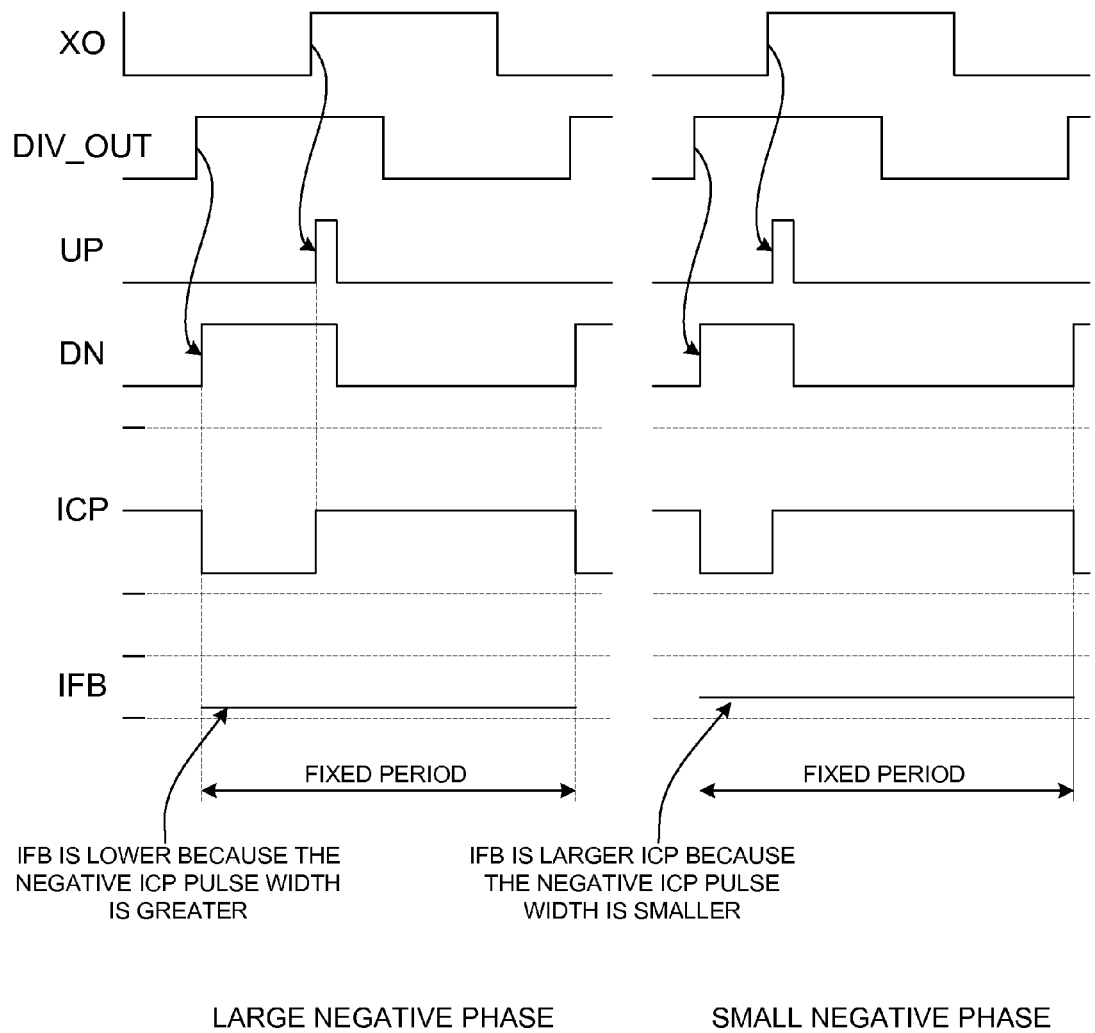
FIG. 13B is a waveform diagram that illustrates an operation of the ADC-Based Mixed-Mode Digital PLL of FIG. 6 in a situation in which the phase difference between the reference clock signal XO and the feedback signal DIV_OUT is negative.

FIG. 13B is a waveform diagram that illustrates an operation of the ADC-Based Mixed-Mode Digital PLL of FIG. 6. In both the time period illustrated on the left and in the time period illustrated on the right, the phase differences between reference clock signal XO and feedback signal DIV_OUT are negative (i.e., XO transitions high after DIV_OUT transitions high). The magnitude of the ICP current pulses are therefore negative. Where the phase difference is greater as indicated by the time period illustrated to left in FIG. 13B, the pulse width of ICP is wider and the feedback current IFB has a greater negative magnitude.

Figure 1:
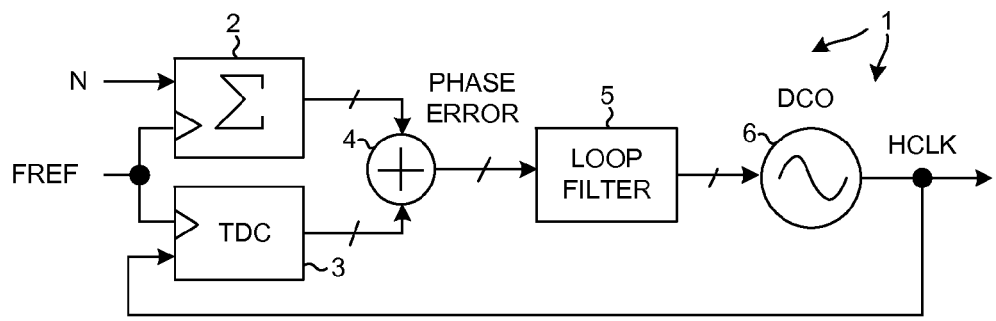
FIG. 1 (Prior Art) is a block diagram of a conventional Time-to-Digital Converter All-Digital Phase-Locked Loop (TDC ADPLL).
Figure 2:
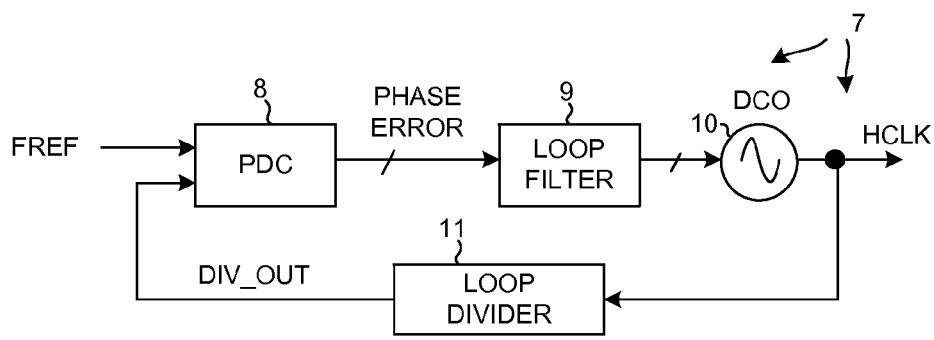
FIG. 2 (Prior Art) is a block diagram of a conventional Phase-to-Digital Converter All-Digital Phase-Locked Loop (PDC ADPLL).
Figure 3:
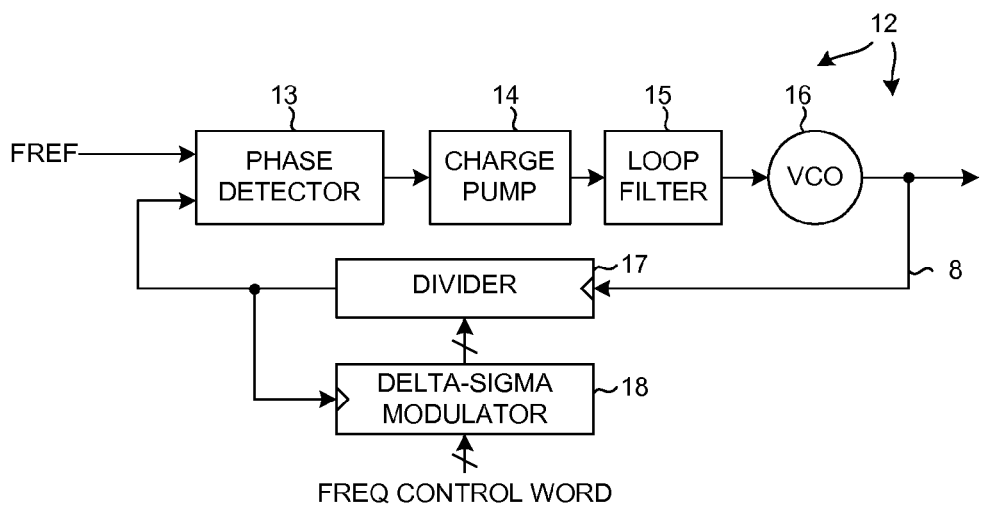
FIG. 3 (Prior Art) is a block diagram of a conventional analog PLL.
Figure 14:
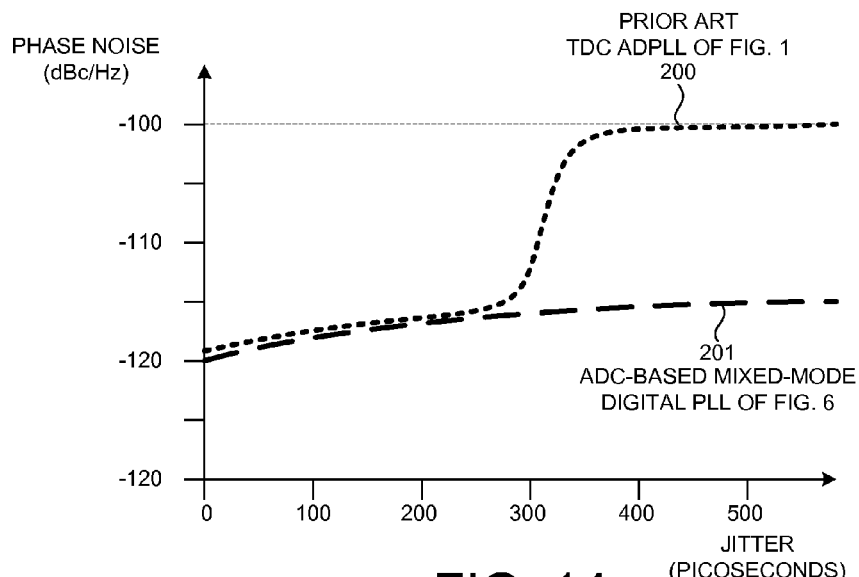
FIG. 14 is a chart that illustrates an advantageous aspect of the ADC-Based Mixed-Mode Digital PLL of FIG. 6.

FIG. 14 is a chart that illustrates another advantageous aspect of the ADC-Based Mixed-Mode Digital PLL of FIG. 6. A conventional TDC ADPLL such as the TDC ADPLL of FIG. 1 is typically sensitive to reference clock jitter. As indicated by line 200, as reference clock jitter is increased the conventional TDC ADPLL of FIG. 1 exhibits a considerable increase in phase noise when the magnitude of this jitter reaches 300 picoseconds. In contrast, as indicated by line 201, the ADC-Based Mixed-Mode Digital PLL of FIG. 6 is less sensitive to reference clock jitter and does not exhibit a considerable increase in phase noise.

Figure 15:
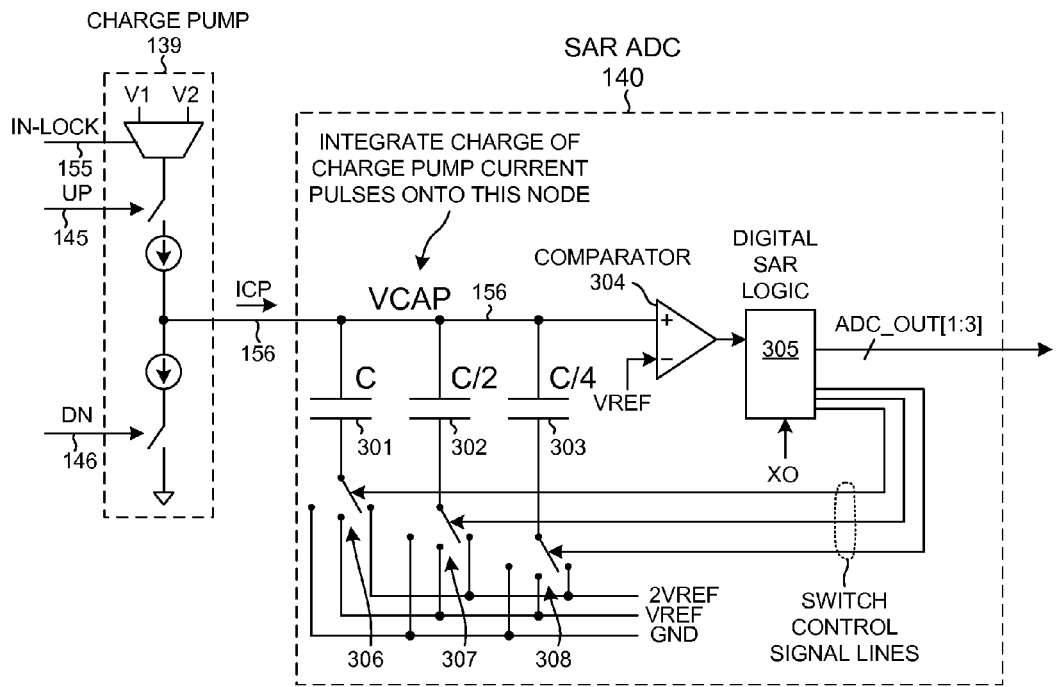
FIG. 15 is a diagram of a successive approximation ADC (SAR ADC) usable for the ADC 140 within the PLL of FIG. 6.

FIG. 15 that shows an example in which the ADC 140 of the ADC-Based Mixed-Mode Digital PLL of FIG. 6 is a Successive Approximation ADC (SAR ADC). SAR ADC is not an oversampling ADC but rather is a Nyquist rate ADC. SAR ADC 140 includes a first capacitor 301 of capacitance C, a second capacitor 302 of capacitance C/2, a third capacitor 303 of capacitance C/4, a comparator 304, an amount of digital successive approximation logic 305, and three switches 306-308. Initially charge pump 139 either supplies an amount of charge onto node 156 or pulls an amount of charge off of node 156 as explained above in connection with FIG. 9, 13A and 13B. The integration of charge onto the capacitance of node 156 starts upon the rising edge of one of the signals XO or DIV_OUT and stops when the other of the signals XO or DIV_OUT has a rising edge as explained above in connection with FIGS. 13A and 13B. At this time, the switches 306-308 are in states as determined by the prior analog-to-digital conversion. The bottom plate of each of the binary-weighted capacitors is therefore coupled to either a ground potential node, or to a reference voltage VREF node, or to a reference voltage 2VREF node. In one advantageous aspect, switches 306-308 are left in states they were in at the end of the prior analog-to-digital conversion such that the voltage on node 156 is a midrange voltage when the charge pump is charging or discharging node 156. Keeping the voltage on node 156 at a midrange voltage when the charge pump is charging or discharging node 156 maintains linearity of the charge pump.

Once charging or discharging of node 156 has been completed, the UP and DN current sources of the charge pump are effectively isolated from node 156 and SAR ADC 140 then performs an analog-to-digital conversion. The digital SAR logic 305 controls all three switches 306-308 such that the bottom plates of capacitors 301-303 are coupled to the VREF node. Comparator 304 determines whether the voltage on node 156 is higher or lower than the voltage VREF on the non-inverting input lead of comparator 304. If the voltage on node 156 is higher than VREF, then the most significant bit ADC_OUT[1] of ADC_OUT[1:3] is set to a digital "1" and switch 306 is controlled to couple the bottom plate of capacitor 301 to the ground potential node. If, on the other hand, the voltage on node 156 is lower than VREF, then the most significant bit ADC_OUT[1] is set to a digital "0" and switch 306 is controlled to couple the bottom plate of capacitor 301 to the 2VREF node. Next, the value of the second bit ADC_OUT[2] is determined. Comparator 304 again determines whether the voltage on node 156 is higher or lower than VREF. If the voltage on node 156 is higher than VREF, then the digital SAR logic 305 controls switch 307 to couple the bottom plate of capacitor 302 to the ground potential node and bit ADC_OUT[2] is set to a digital "1", otherwise switch 307 is controlled to couple the bottom plate of capacitor 302 to the 2VREF node and ADC_OUT[2] is set to a digital "0". Next, the value of the third bit ADC_OUT[3] is determined. Comparator 304 again determines whether the voltage on node 156 is higher or lower than VREF. If the voltage on node 156 is higher than VREF, then the digital SAR logic 305 controls switch 308 to couple the bottom plate of capacitor 303 to the ground potential node and bit ADC_OUT[3] is set to a digital "1", otherwise switch 308 is controlled to couple the bottom plate of capacitor 303 to the 2VREF node and ADC_OUT[3] is set to a digital "0".

Accordingly, the most significant bit ADC_OUT[1] of the three-bit digital value ADC_OUT[1:3] indicates whether the sample voltage on node 156 was higher or lower than VREF. The other two bits ADC_OUT[2:3] indicate the magnitude of the voltage difference between VREF and the sample voltage on node 156. One such digitizing operation is performed each cycle of the reference clock signal XO.

Figure 16:
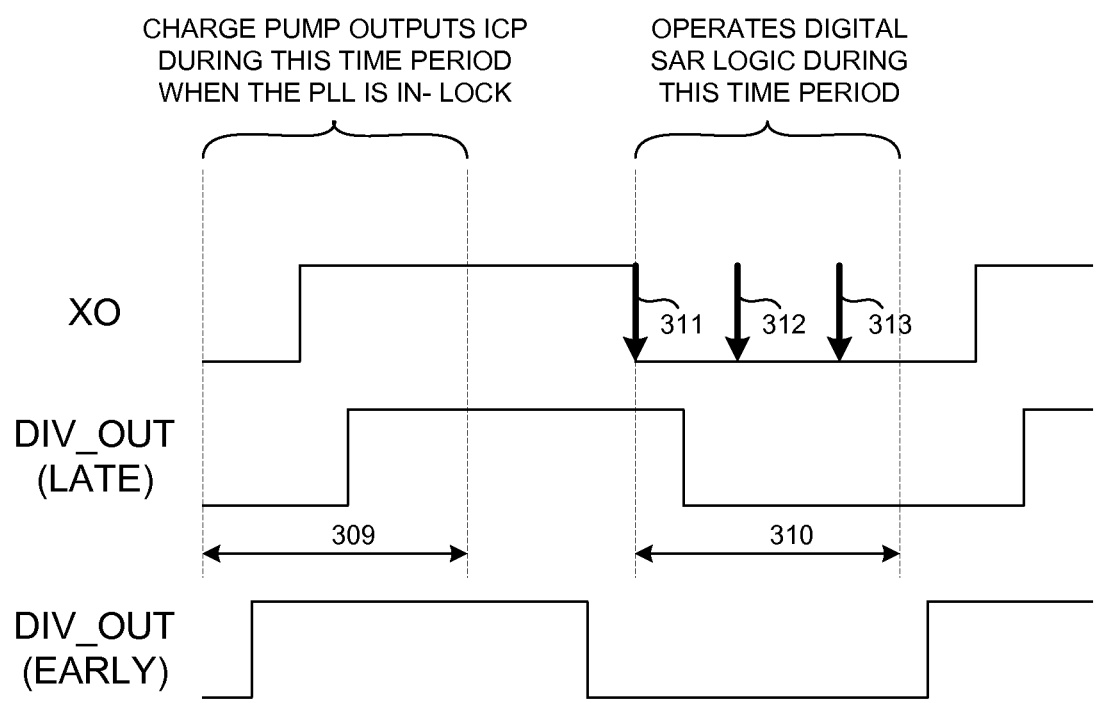
FIG. 16 is a waveform diagram that illustrates an operation of the SAR ADC of FIG. 15.

FIG. 16 is a waveform diagram that shows when during a cycle of the reference clock signal XO the charge pump charges/discharges node 156 and when during the cycle the SAR ADC converts the voltage on node 156 into digital value ADC_OUT[1:3]. The charge pump charges/discharges node 156 during the last part of a prior cycle and/or during the first part 309 of the cycle. Regardless of whether DIV_OUT leads or follows XO in phase, the charge pump charging or discharging of node 156 is completed before the falling edge of the signal XO occurs. The SAR ADC converts the voltage on node 156 into digital value ADC_OUT[1:3] during a second part 310 of the XO signal cycle starting on the falling edge of the signal XO. The three successive comparisons and manipulations of switches 306, 307 and 308 are initiated using delayed versions of the signal XO. The delayed versions are generated by a delay line within digital SAR logic block 305. The falling edge 311 at a first time is used to initiate the first comparison by comparator 304 and the associated switching of switch 306. The falling edge 312 of a delayed version of XO at a second time is used to initiate the second comparison by comparator 304 and the associated switching of switch 307. The falling edge 313 of a further delayed version of XO at a third time is used to initiate the third comparison by comparator 304 and the associated switching of switch 308.

The only analog circuit in SAR ADC 140 of FIG. 15 is comparator 304. All other components are either digital logic or are passive circuit components. The SAR ADC embodiment of the ADC-Based Mixed-Mode ADC therefore generally has lower power consumption than the CT Sigma-Delta ADC embodiment of the ADC-Based Mixed-Mode ADC. Because the only analog component is a comparator that can operate with substantial non-linearity as opposed to an operational amplifier that must have superior linearity, the SAR ADC embodiment of the ADC-Based Mixed-Mode ADC can also operate at a lower supply voltage than the CT Sigma-Delta ADC embodiment of the ADC-Based Mixed-Mode ADC.

Figure 17:
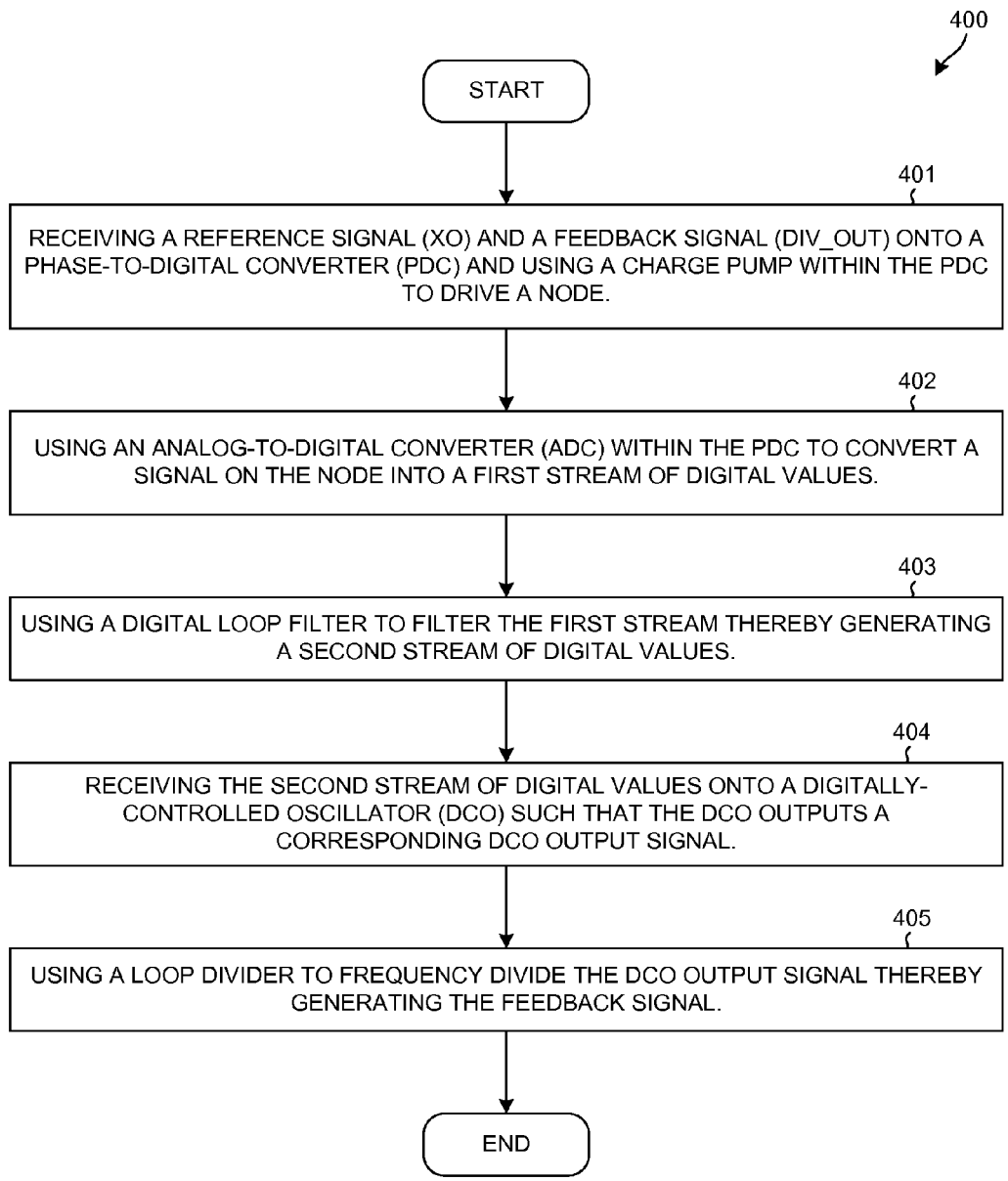
FIG. 17 is a simplified flowchart of a method in accordance with one novel aspect.

FIG. 17 is a flowchart of a method 400 in accordance with one novel aspect. A reference signal and a feedback signal are received (step 401) onto a Phase-to-Digital Converter (PDC). A charge pump within the PDC is used to drive a node. An Analog-to-Digital Converter (ADC) within the PDC converts (step 402) a signal on the node into a first stream of multi-bit digital values. In one example, the signal is a small amplitude midrange voltage signal and the node is a "virtual ground" node. A digital loop filter filters (step 403) the first stream of multi-bit digital values, thereby generating a second stream of multi-bit digital values. A Digitally-Controlled Oscillator (DCO) receives the second stream of multi-bit digital values and outputs (step 404) a corresponding DCO output signal. A loop divider frequency divides the DCO output signal thereby generating (step 405) the feedback signal.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A Phase-Locked Loop (PLL) circuit, comprising:
 a Phase-to-Digital Converter (PDC) configured to receive a reference signal and a feedback signal and to generate a stream of digital phase error words, wherein the PDC includes a charge pump and an Analog-to-Digital Converter (ADC), wherein the charge pump is configured to supply a pulse train to the ADC;
 a digital loop filter configured to receive the stream of digital phase error words, to filter the stream, and to output a stream of digital tuning words;
 a Digitally-Controlled Oscillator (DCO) configured to receive the stream of digital tuning words and to output an oscillating signal; and
 a loop divider configured to receive the oscillating signal and to output the feedback signal,
 wherein the charge pump is configured to supply the pulse train to an input node of the ADC, the pulse train includes a plurality of current pulses, each current pulse has a current magnitude, the charge pump is configured to receive a digital lock signal indicative of whether the PLL is in lock and to control the current magnitude as a function of the lock signal, the current magnitude of the current pulses is greater when the lock signal indicates that the PLL is in-lock, and the current magnitude of the current pulses is smaller when the lock signal indicates that the PLL is not in-lock.

2. The PLL circuit of claim 1, wherein the PDC further includes a Phase-Frequency Detector (PFD) configured to receive the reference signal, to receive the feedback signal, to output at least one control signal to the charge pump.

3. The PLL circuit of claim 1, wherein the ADC is a continuous-time delta-sigma oversampling analog-to-digital converter.

4. The PLL circuit of claim 1, wherein the ADC is a successive approximation analog-to-digital converter (SAR ADC).

5. The PLL circuit of claim 1, wherein the ADC is a switched capacitor analog-to-digital converter.

6. The PLL circuit of claim 1, wherein the ADC is an oversampling analog-to-digital converter.

7. The PLL circuit of claim 1, wherein the ADC is a continuous-time analog-to-digital converter.

8. The PLL circuit of claim 1, wherein the ADC is discrete-time analog-to-digital converter.

9. The PLL circuit of claim 1, wherein the charge pump is configured to supply the pulse train to the input node of the ADC, each current pulse has a pulse width, and the charge pump is configured to control the pulse widths of the plurality of current pulses proportionally with changes in phase between the reference signal and the feedback signal.

10. The PLL circuit of claim 9, wherein some of the current pulses are positive current pulses, and others of the current pulses are negative current pulses.

11. The PLL circuit of claim 1, wherein the charge pump is configured to supply the pulse train to the input node of the ADC, and a voltage signal on the input node is a small amplitude midrange voltage signal when the PLL is in-lock.

12. The PLL circuit of claim 1, wherein the charge pump is configured to supply the pulse train to an input lead of an operational amplifier, and the operational amplifier is a part of the ADC.

13. The PLL circuit of claim 1, wherein the reference signal is a periodic signal of a frequency, and the ADC is configured to output the digital phase error words at a rate that is not substantially less than the frequency of the reference signal.

14. The PLL circuit of claim 1, further comprising a cellular telephone integrated with the PLL circuit.

15. A method, comprising:
receiving a reference signal and a feedback signal at a Phase-to-Digital Converter (PDC);
using a charge pump within the PDC to drive a node;
using an Analog-to-Digital Converter (ADC) within the PDC to convert a signal on the node into a first stream of multi-bit digital values;
using a digital loop filter to filter the first stream of multi-bit digital values and thereby generate a second stream of multi-bit digital values;
receiving the second stream of multi-bit digital values at a Digitally-Controlled Oscillator (DCO) configured to output a corresponding DCO output signal;
using a loop divider to frequency divide the DCO output signal and thereby generate the feedback signal, wherein the PDC, the digital loop filer, the DCO and the loop divider are parts of a Phase-Locked Loop (PLL); and
changing a gain of the charge pump such that the charge pump operates with a larger gain when the PLL is in lock, and with a smaller gain when the PLL is not in lock.

16. The method of claim 15, wherein the ADC is taken from a group consisting of: a continuous-time delta-sigma oversampling analog-to-digital converter and a successive approximation analog-to-digital converter (SAR ADC).

17. The method of claim 15, wherein the charge pump drives the node by supplying a pulse train to the node, and a voltage signal on the node is a small amplitude midrange signal when the PLL is in-lock.

18. The method of claim 17, wherein the pulse train is a stream of current pulses, each current pulse has a pulse width, and the pulse widths are controlled to change proportionally with changes in phase between the reference signal and the feedback signal.

19. A Phase-Locked Loop (PLL) circuit, comprising:
a digital loop filter configured to receive a stream of multi-bit digital values, to filter the stream, and to thereby generate a stream of digital tuning words;
an oscillator configured to receive the stream of digital tuning words and to output an oscillating signal;
a divider configured to receive the oscillating signal and to output a feedback signal;
means for receiving a reference clock signal and the feedback signal, and for outputting the stream of multi-bit digital values, wherein the means for receiving and for outputting includes a charge pump and an Analog-to-Digital Converter (ADC),
wherein the charge pump is configured to operate with a larger gain when the PLL is in lock, and to operate with a smaller gain when the PLL is not in lock.

20. The PLL circuit of claim 19, wherein the means for receiving and for outputting is a Phase-to-Digital Converter (PDC), the charge pump is configured to supply current pulses to a node, and the ADC is configured to digitize a voltage signal on the node to thereby generate the stream of multi-bit digital values.

21. The PLL circuit of claim 20, wherein the voltage signal on the node is a small amplitude midrange voltage signal when the PLL is operating in lock.

22. The PLL circuit of claim 19, wherein the means for receiving and for outputting is also configured to receive a digital signal and to change the gain of the charge pump based on a value of the digital signal.

23. The PLL of circuit claim 19, further comprising a cellular telephone integrated with the PLL circuit.

24. A Phase-Locked Loop (PLL) circuit, comprising:
a Phase-to-Digital Converter (PDC) configured to receive a reference signal and a feedback signal;
means within the PDC for driving a node;
Analog-to-Digital Converter (ADC) means within the PDC for converting a signal on the node into a first stream of multi-bit digital values;
digital loop filtering means for filtering the first stream of multi-bit digital values and thereby generate a second stream of multi-bit digital values;
a Digitally-Controlled Oscillator (DCO) configured to receive the second stream of multi-bit digital values and configured to output a corresponding DCO output signal;
loop dividing means for frequency dividing the corresponding DCO output signal to generate the feedback signal, wherein the PDC, the digital loop filtering means, the DCO, and the loop dividing means are parts of the PLL; and
means for changing a gain of the means within the PDC for driving the node such that the means within the PDC for driving the node operates with a larger gain when the PLL is in lock, and with a smaller gain when the PLL is not in lock.

* * * * *